United States Patent
Ho et al.

(10) Patent No.: US 7,314,815 B2
(45) Date of Patent: Jan. 1, 2008

(54) MANUFACTURING METHOD OF ONE-TIME PROGRAMMABLE READ ONLY MEMORY

(75) Inventors: Chia-Hua Ho, Hsinchu (TW); Yen-Hao Shih, Hsinchu (TW); Hsiang-Lan Lung, Hsinchu (TW); Shih-Ping Hong, Hsinchu (TW); Shih-Chin Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/308,550

(22) Filed: Apr. 6, 2006

(65) Prior Publication Data

US 2006/0199361 A1    Sep. 7, 2006

Related U.S. Application Data

(62) Division of application No. 10/907,442, filed on Apr. 1, 2005, now Pat. No. 7,053,406.

(51) Int. Cl.
H01L 21/336 (2006.01)
H01L 21/326 (2006.01)
H01L 21/479 (2006.01)
H01L 21/44 (2006.01)

(52) U.S. Cl. .............. 438/597; 438/281; 438/601; 438/467

(58) Field of Classification Search ............... 438/597, 438/333, 131, 136, 139, 140, 281, 600
See application file for complete search history.

(56) References Cited

U.S. PATENT DOCUMENTS

| | | | | |
|---|---|---|---|---|
| 5,789,795 A | * | 8/1998 | Sanchez et al. | 257/530 |
| 6,185,122 B1 | | 2/2001 | Johnson et al. | 365/103 |
| 6,307,213 B1 | * | 10/2001 | Huang et al. | 257/50 |
| 6,753,244 B2 | * | 6/2004 | Wu et al. | 438/601 |
| 6,806,551 B2 | * | 10/2004 | Liu et al. | 257/529 |

* cited by examiner

Primary Examiner—Chuong A. Luu
(74) Attorney, Agent, or Firm—Jianq Chyun IP Office

(57) ABSTRACT

An one-time programmable read only memory is provided. An N-type doping region and a first P-type doping layer are disposed in a P-type semiconductor substrate sequentially. A second P-type doping layer is disposed between the first P-type doping layer and the N-type doping region. The second P-type doping layer with higher doping level, which has a linear structure, is served as a bit line. An electrically conductive layer is disposed over the P-type semiconductor substrate. The electrically conductive layer also has a linear structure that crosses over the first P-type doping layer. The first N-type doping layer is disposed in the P-type semiconductor substrate between the electrically conductive layer and the first P-type doping layer. The arrangement of N-type and P-type doping layer is used to be selective diode device. An anti-fuse layer is disposed between the electrically conductive layer and the first N-type doping layer.

8 Claims, 11 Drawing Sheets

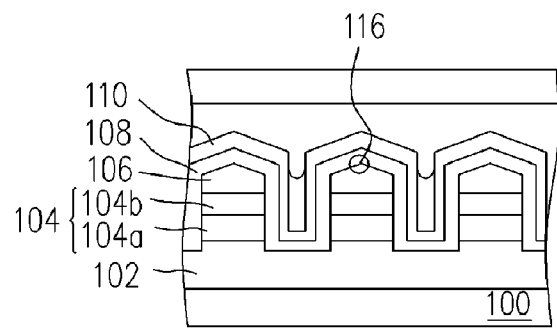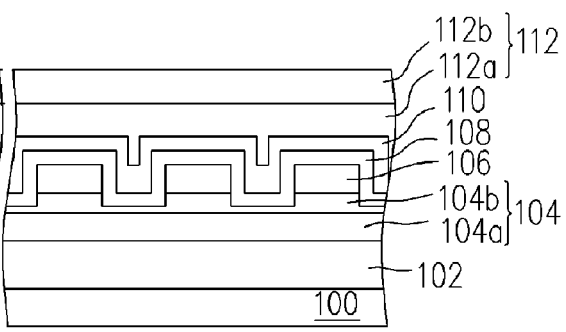
FIG. 6A          FIG. 6B
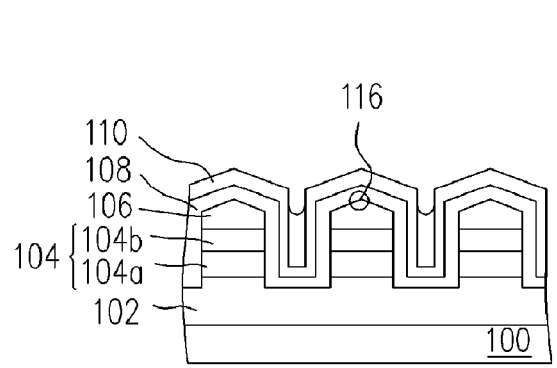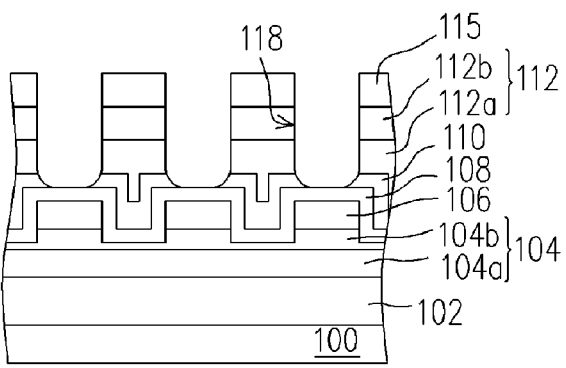
FIG. 7A          FIG. 7B

MANUFACTURING METHOD OF ONE-TIME PROGRAMMABLE READ ONLY MEMORY

CROSS-REFERENCE TO RELATED APPLICATION

This is a divisional application of application Ser. No. 10/907,442, filed on Apr. 1, 2005 now U.S. Pat. No. 7,053,406, which is now allowed. The entirety of each of the above-mentioned patent applications is hereby incorporated by reference herein and made a part of this specification.

BACKGROUND OF THE INVENTION

1. Field of the Invention

The present invention relates to a manufacturing method of a semiconductor device. More particularly, the present invention relates to a manufacturing method of a one-time programmable read only memory.

2. Description of the Related Art

With the power of microprocessors continues to expand, the amount of computation in given software programs increases exponentially. As a result, there is an urgent demand for cheap and high storage capacity memories from semiconductor manufacturers. According to the difference in read/write capability, memories can be roughly classified into read only memory (ROM) and random access memory (RAM).

Read only memory is a type of non-volatile data storage device that can retain stored data even when the power is cut off. Hence, most standard electrical products are equipped with some read only memory for holding an initialization program that boots up an operation from the cold.

According to data storage format, read only memory (ROM) can be further sub-divided into mask ROM, one-time programmable ROM, erasable programmable ROM, electrically erasable programmable ROM and so on. Since data can be programmed into a one-time programmable ROM outside the factory according to the particular environment the memory is supposed to be working in, one-time programmable ROM is more convenient to work with than the mask ROM.

A conventional one-time ROM cell includes a diode and an anti-fuse. In general, the presence or the absence of a PN diode linking a word line with a bit line represents the logical value of a stored data bit. Hence, keeping the anti-fuse as it is or breaking open the anti-fuse effectively sets the data value in each memory cell.

For example, in U.S. Pat. No. 6,185,122, a one-time read only memory having vertical stack structure in disclosed. In this patent, a plurality of linear conductive wires is alternately stacked so that the wires cross over each other above a substrate. A diode and an anti-fuse layer are set up between a top conductive wire and a bottom conductive wire in a neighboring pair. The diode and the anti-fuse together form a memory cell. However, in the aforementioned patent, the PN diode is constructed by joining a P-doped polysilicon layer with an N-doped polysilicon layer. Because polysilicon typically includes a large number of grains having a large variation in sizes and many grain boundaries, the properties at the PN junction can hardly be uniform and the leakage pathways can be many. Therefore, a memory device having polysilicon PN diodes may produce memory cells having a wide distribution of properties and a leakage current in the memory cells more readily under a reverse bias voltage.

SUMMARY OF THE INVENTION

Accordingly, at least one objective of the present invention is to provide a one-time programmable read only memory and manufacturing method thereof capable of standardizing memory cell properties and reducing reverse bias leakage current.

At least a second objective of the present invention is to provide a one-time programmable read only memory and manufacturing method thereof capable of simplifying the processing steps, increasing the level of device integration and lowering the production cost.

To achieve these and other advantages and in accordance with the purpose of the invention, as embodied and broadly described herein, the invention provides a one-time programmable read only memory having at least a first electrically conductive type semiconductor substrate, a second electrically conductive type doping region, a first electrically conductive type first doping layer, a first electrically conductive type second doping layer, an electrically conductive layer, a second electrically conductive type first doping layer and an anti-fuse layer. The second electrically conductive type doping region is disposed in the first electrically conductive type semiconductor substrate. The first electrically conductive type first doping layer is disposed in the first electrically conductive type semiconductor substrate above the second electrically conductive type doping region. The first electrically conductive type second doping layer is disposed between the second electrically conductive type doping region and the first electrically conductive type first doping layer. Furthermore, the first electrically conductive type second doping layer has a linear structure serving as a bit line. The electrically conductive layer is disposed on the first electrically conductive type semiconductor substrate. The electrically conductive layer has a linear structure that crosses over and is perpendicular to the electrically conductive first type first doping layer. The second electrically conductive type first doping layer is disposed in the first electrically conductive type semiconductor substrate between the electrically conductive layer and the first electrically conductive type first doping layer. The anti-fuse layer is disposed between the electrically conductive layer and the second electrically conductive type first doping layer.

In the aforementioned one-time programmable read only memory, the first electrically conductive type is P-type if the second electrically conductive type is N-type; and the first electrically conductive type is N-type if the second electrically conductive type is P-type. Furthermore, the top section of the second electrically conductive type first doping layer has a sharp edge.

In addition, the aforementioned one-time programmable read only memory further includes an inter-layer insulating layer disposed on the semiconductor substrate. The inter-layer insulating layer has a trench disposed above the second electrically conductive type second doping layer. The electrically conductive layer is disposed inside the trench and the anti-fuse layer is disposed between inter-layer insulating layer and the electrically conductive layer.

Since the PN (or NP) diode of the aforementioned one-time programmable read only memory is formed within the same semiconductor layer fabricated from mono-crystalline silicon, semiconductor substrate, the crystallized poly-crystalline semiconductor, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance.

Because the second electrically conductive type first doping layer has a tower structure, the breakdown region of the anti-fuse layer is self-limited so that an ideal logic state is produced. Furthermore, the surface of the second electrically conductive type first doping layer has a bulging sharp edge. The sharp edge concentrates electric charges so that the anti-fuse layer is more readily broken through an electrostatic discharge. Ultimately, the programming voltage of the memory is reduced.

Since the one-time programmable read only memory of the present invention has a simple structure and occupies a memory cell area (about $4F^2$), the level of integration of the memory devices is increased. Moreover, the breakdown voltage and the device performance of the memory can be systematically controlled through adopting a different material to fabricate the anti-fuse layer.

The present invention also provides a method of fabricating a one-time programmable read only memory including the following steps. First, a first electrically conductive type semiconductor substrate is provided. Thereafter, a second electrically conductive type doping region, a first electrically conductive type second doping layer, a first electrically conductive type first doping layer and a second electrically conductive type first doping layer are sequentially formed in the first electrically conductive type semiconductor substrate. Next, the first electrically conductive type semiconductor substrate is patterned to form a linear-shape first electrically conductive type second doping layer, a block-shape first electrically conductive type first doping layer and a block-shape second electrically conductive type first doping layer. An etching operation is carried out to produce a sharp edge at the top section of the block-shaped second electrically conductive type first doping layer and then an anti-fuse layer is formed over the first electrically conductive type semiconductor substrate. After that, an etching stop layer is deposited and plated over the anti-fuse layer and then an inter-layer insulating layer is formed over the etching stop layer. The inter-layer insulating layer is patterned to form a trench that exposes the etching stop layer. The trench crosses over and is perpendicular to the linear-shape second electrically conductive type first doping layer. Finally, the etching stop layer exposed by the trench is removed and then an electrically conductive layer is formed in the trench.

In the aforementioned method of fabricating the one-time programmable read only memory, the patterning of the first electrically conductive type semiconductor substrate to form the linear-shape first electrically conductive type second doping layer, the block-shape first electrically conductive type first doping layer and the block-shape second electrically conductive type first doping layer includes the following steps. first, a first patterning process is carried out to remove a portion of the second electrically conductive type first doping layer, the first electrically conductive type first doping layer and the first electrically conductive type second doping layer to expose the second electrically conductive type doping region and form a linear-shape second electrically conductive type first doping layer, a linear-shape first electrically conductive type first doping layer and a linear-shape first electrically conductive type second doping layer. Thereafter, a second patterning process is carried out to remove a portion of the second electrically conductive type first doping layer and the first electrically conductive type first doping layer to form a block-shape second electrically conductive type first doping layer and a block-shaped first electrically conductive type first doping layer.

In the aforementioned method of fabricating the one-time programmable read only memory, a patterned NPN (or PNP) structure is formed in the semiconductor substrate. Thereafter, two photolithographic and etching processes are carried out to define a bit line and a silicon tower structure and form an isolated PN (or NP) diode and bit line. Since the PN (or NP) diode of the aforementioned one-time programmable read only memory is formed within the same semiconductor layer fabricated from mono-crystalline silicon, semiconductor substrate, the crystallized poly-crystalline semiconductor, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance. Furthermore, the memory cell has a simple structure. Hence, fewer masks are required to fabricate the memory cells and the total cost of producing of the memory is reduced.

Because the second electrically conductive type first doping layer has a tower structure, the breakdown region of the anti-fuse layer is self-limited so that an ideal logic state is produced. Furthermore, the etching process produces a bulging sharp edge on the surface of the second electrically conductive type first doping layer. The sharp edge concentrates electric charges so that the anti-fuse layer is more readily broken through an electrostatic discharge. Hence, a lower voltage can be applied to program the memory.

In addition, a self-aligned process is used to form a memory cell structure between a word line and a bit line in the fabrication of the one-time programmable read only memory. Hence, the total number of masking step is reduced. Moreover, the self-aligned process is capable of producing memory cells with a smaller and tighter dimension so that the level of integration of the memory device can be increased.

The breakdown voltage and device performance of the memory can be controlled by changing the material constituting the anti-fuse layer. Furthermore, the anti-fuse layer is formed after isolating the PN (or the NP) diode structure. Hence, the material consisted of anti-fuse layer can be easily changed. In addition, an etching stop layer is disposed over the anti-fuse layer. Since the etching stop layer has an etching selectivity different from the anti-fuse layer, the anti-fuse layer can have a standard thickness.

Moreover, the breakdown voltage of the memory cell is determined by the thickness of the anti-fuse layer and the thickness of the anti-fuse layer is determined by the deposition process rather than the etching and chemical-mechanical polishing process. In other words, the method of the present invention can have a larger processing window because the processing window is unaffected by the etching and the chemical-mechanical polishing process.

The present invention also provides an alternative method of fabricating a one-time programmable read only memory including the following steps. First, a first electrically conductive type semiconductor substrate is provided. Thereafter, a second electrically conductive type doping region, a first electrically conductive type second doping layer, a first electrically conductive type first doping layer and a second electrically conductive type first doping layer are sequentially formed in the first electrically conductive type semiconductor substrate. Next, the first electrically conductive type semiconductor substrate is patterned to form a linear-shape first electrically conductive type second doping layer, a block-shape first electrically conductive type first doping layer, a block-shape second electrically conductive type first doping layer and then an inter-layer insulating layer is formed over the first electrically conductive type semiconductor substrate. The inter-layer insulating layer is patterned to form a trench that exposes the second electrically conductive type first doping layer. The trench crosses over and is perpendicular to the linear-shape second electrically conductive type first doping layer. An anti-fuse layer is formed at the bottom and the sidewalls of the trench. Finally, an electrically conductive layer is formed in the trench.

In the aforementioned method of fabricating the one-time programmable read only memory, the patterning of the first electrically conductive type semiconductor substrate to form the linear-shape first electrically conductive type second doping layer, the block-shape first electrically conductive type first doping layer and the block-shape second electrically conductive type first doping layer includes the following steps. First, a first patterning process is carried out to remove a portion of the second electrically conductive type first doping layer, the first electrically conductive type first doping layer and the first electrically conductive type second doping layer to expose the second electrically conductive type doping region and form a linear-shape second electrically conductive type first doping layer, a linear-shape first electrically conductive type first doping layer and a linear-shape first electrically conductive type second doping layer. Thereafter, a second patterning process is carried out to remove a portion of the second electrically conductive type first doping layer and the first electrically conductive type first doping layer to form a block-shape second electrically conductive type first doping layer and a block-shaped first electrically conductive type first doping layer.

In the aforementioned method of fabricating the one-time programmable read only memory, after patterning the first electrically conductive type semiconductor substrate but before forming the inter-layer insulating layer over the first electrically conductive type semiconductor substrate further includes performing an etching operation to form a sharp edge in a top section of the block-shape second electrically conductive type first doping layer.

In the aforementioned method of fabricating the one-time programmable read only memory, a patterned NPN (or PNP) structure is formed in the semiconductor substrate. Thereafter, two photolithographic and etching processes are carried out to define a bit line and a silicon tower structure and form an isolated mono-crystalline silicon PN (or NP) diode and bit line. Since the PN (or NP) diode of the aforementioned one-time programmable read only memory is formed within the same semiconductor layer fabricated from mono-crystalline silicon semiconductor substrate, the crystallized poly-crystalline semiconductor substrate, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance. Furthermore, the memory cell has a simple structure so that fewer masks are required to fabricate the memory cells and the total cost of producing of the memory is reduced.

Since the anti-fuse layer is formed after defining the word line pattern (the trench), anti-fuse material can be easily changed and the thickness of the anti-fuse layer is unaffected by the etching operation. Furthermore, by changing the anti-fuse material, the breakdown voltage and device performance can be easily controlled.

In addition, the breakdown voltage of the memory cell is determined by the thickness of the anti-fuse layer and the thickness of the anti-fuse layer is determined by the deposition process rather than the etching and chemical-mechanical polishing process. In other words, the method of the present invention can have a larger processing window because the processing window is unaffected by the etching and the chemical-mechanical polishing process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 9A and FIGS. 2B through 9B are schematic cross-sectional views along lines A-A' and B-B' of FIG. 1A showing the steps for fabricating the one-time programmable read only memory according to the first embodiment of the present invention.

FIGS. 14A through 16A and FIGS. 14B through 16B are schematic cross-sectional views along lines A-A' and B-B' of FIG. 13A showing the steps for fabricating the one-time programmable read only memory according to the third embodiment of the present invention.

DESCRIPTION OF THE PREFERRED EMBODIMENTS

Figure 1A:
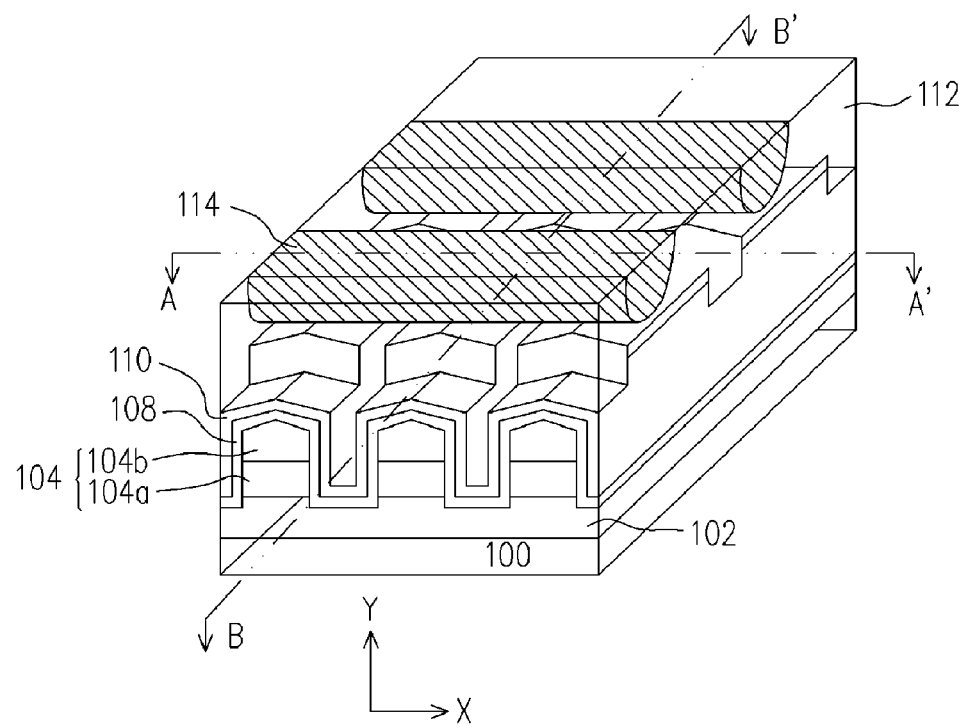
FIG. 1A is a perspective view of an one-time programmable read only memory according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figures 1B, 1C:
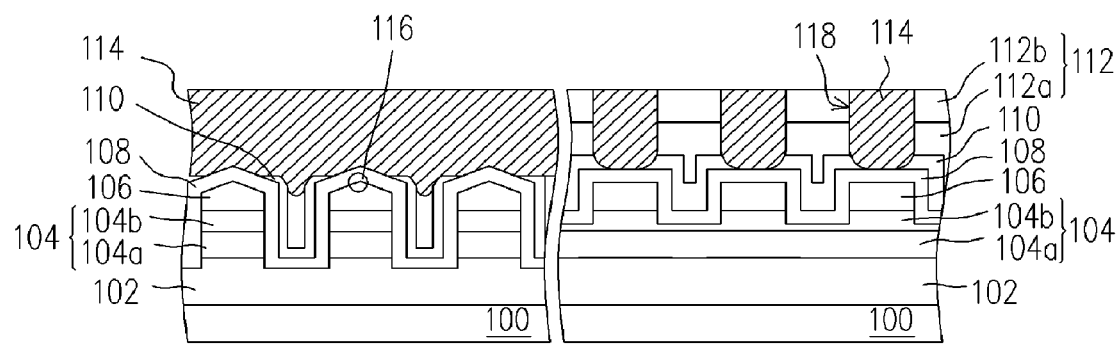
FIGS. 1B and 1C are schematic cross-sectional views along line A-A' and B-B' of FIG. 1A.
Figure 1D:
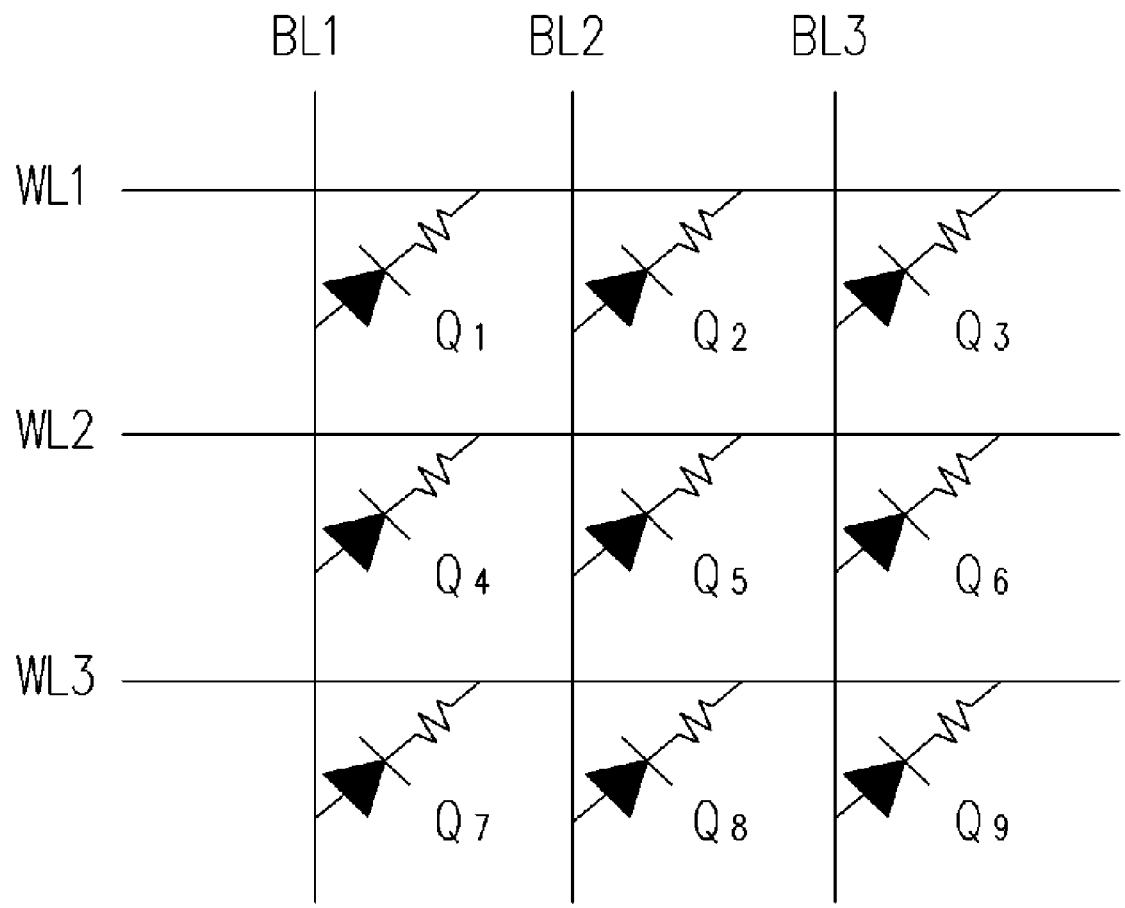
FIG. 1D is an equivalent circuit diagram of the one-time programmable read only memory in to the present invention.

FIG. 1A is a perspective view of an one-time programmable read only memory according to a first embodiment of the present invention. FIGS. 1B and 1C are schematic cross-sectional views along line A-A' and line B-B' of FIG. 1A. FIG. 1D is an equivalent circuit diagram of the one-time programmable read only memory of the present invention. As shown in FIGS. 1A to 1C, the one-time programmable read only memory of the present invention comprises at least a P-type semiconductor substrate 100, an N-type doping region 102, a P-type doping layer 104, an N-type doping layer 106, an anti-fuse layer 108, an etching stop layer 110, an inter-layer insulating layer 112 and an electrically conductive layer 114.

The N-type doping region 102 is disposed inside the P-type semiconductor substrate 100. The P-type doping layer 104 is also disposed inside the P-type semiconductor substrate 100 above the N-type doping region 102. The P-type doping layer 104 has a linear shape and comprises a $P^+$-type doping region 104a and a P-type doping region 104b. The $P^+$-type doping region 104a has a higher dopant concentration than the P-type doping region 104b. Furthermore, the dopants in the $P^+$-type doping region 104a are implanted to a grater depth than the P-type doping region 104b. The P-type doping region 104b serves as the P-type region of a diode and the $P^+$-type doping region 104a serves as a bit line.

The electrically conductive layer 114 is disposed over the P-type semiconductor substrate 100 as a word line. The electrically conductive layer 114 has a linear shape and crosses over the P-type doping layer 104. Typically, the electrically conductive layer is fabricated using electrically conductive doped semiconductor, doped polysilicon or metal (for example, tungsten or copper).

The N-type doping layer 106 is disposed inside the P-type semiconductor substrate 100 between the electrically conductive layer 114 and the P-type doping layer 104. The N-type doping layer 106 has a tower shape with a bulging sharp edge 116 on its surface. The N-type doping layer 106 and the P-type doping region 104b of the P-type doping layer 104 together form a PN diode. Since the N-type doping layer 106 has a tower shape, the breakdown region of the anti-fuse layer 108 is self-limited to produce a preferred logic state. Furthermore, the bulging sharp edge 116 can concentrate electric charges and effect an electrostatic discharge to breakdown the anti-fuse layer 108 more readily. In other words, the memory cell can have a lower programming voltage.

The anti-fuse layer 108 is disposed between the electrically conductive layer 114 and the N-type doping layer 106. The anti-fuse layer is a silicon oxide layer, for example. However, the anti-fuse layer 108 can be fabricated using a high dielectric constant (a dielectric constant greater than 4) material such as silicon-nitride, silicon-oxynitride, aluminum oxide or hafnium oxide, for example. By selecting the type of material constituting the anti-fuse layer 108, the breakdown voltage and the performance of the memory device can be controlled. For example, if aluminum oxide is used to form the anti-fuse layer 108, the breakdown voltage is lowered and the electrical properties of the memory are enhanced. Beside, a thicker aluminum oxide is served as anti-fuse layer 108, the isolation property is better and the electromigration between chips is reduced. The PN diode and the anti-fuse layer 108 together form an one-time programmable read only memory cell. In general, the presence or absence of a PN diode connecting the word line with the bit line determines the data value stored in a particular memory cell. Yet, the connectivity of the PN diode is determined by the state of the anti-fuse layer 108, whether it is broken or remains intact. For example, if the anti-fuse layer 108 is broken, a large current Isens between the word line and the bit line is detected so that a logic state '0' in the memory cell is implied. Conversely, if the anti-fuse layer 108 is intact, a small current Isens between the word line and the bit line is detected so that a logic state '1' in the memory cell is implied.

The inter-layer insulating layer 112 is disposed over the semiconductor substrate 100. The inter-layer insulating layer 112 has a trench 118 positioned above the N-type doping layer 106 and the electrically conductive layer 114 is disposed inside the trench 118. The anti-fuse layer 108 is disposed between the inter-layer insulating layer 112 and the electrically conductive layer 114. In the present embodiment, the inter-layer insulating layer 112 comprises a borophosphosilicate glass layer 112a and a silicon oxide layer 112b fabricated in a plasma-enhanced chemical vapor deposition using tetra-ethyl-ortho-silicate (TEOS) as a source of reactive gas. However, the inter-layer insulating layer 112 can be a single-layered structure fabricated using other insulating material as well.

The etching stop layer 110 is disposed over the anti-fuse layer 108. The etching stop layer is fabricated using a material having an etching selectivity that differs from the anti-fuse layer 108 such as silicon nitride. In the present embodiment, the etching stop layer 110 over the anti-fuse layer 108 prevents the anti-fuse layer 108 from receiving any damages leading to a change in device performance between chip and chip when the trench 118 is formed in the inter-layer insulating layer 112.

In the aforementioned, the PN (or NP) diode of the aforementioned one-time programmable read only memory is formed within the same semiconductor layer fabricated from mono-crystalline silicon semiconductor substrate, the crystallized poly-crystalline semiconductor substrate, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance.

Because the N-type doping layer 106 has a tower structure, the breakdown region of the anti-fuse layer 108 is self-limited so that an ideal logic state is produced. Furthermore, the surface of the N-type doping layer 106 has a bulging sharp edge 116. The sharp edge 116 concentrates electric charges so that the anti-fuse layer is more readily broken by an electrostatic discharge. Ultimately, the programming voltage for the memory can be reduced.

Since the one-time programmable read only memory of the present invention has a simple structure and occupies a small memory cell area (about $4F^2$), the level of integration of the memory devices is increased. Moreover, the breakdown voltage and the device performance of the memory can be systematically controlled through changing the material used for fabricating the anti-fuse layer 108.

Although the process of forming an NPN structure in a P-type semiconductor substrate the is used to illustrate the fabrication of the one-time programmable read only memory, it is equally feasible to use the aforementioned process to form a PNP structure in an N-type semiconductor substrate.

FIG. 1D is an equivalent circuit diagram of the one-time programmable read only memory of the present invention. A 3×3 array of one-time programmable read only memory cells is shown in FIG. 1D. As shown in FIG. 1D, three parallel word lines WL1~WL3 cross over three parallel bit lines BL1~BL3 perpendicularly. Furthermore, memory cells Q1~Q9 are formed at the junctions between the word lines WL1~WL3 and the bit lines BL1~BL3. Each memory cell comprises a PN diode and a resistor (anti-fuse layer).

In the following, the process of programming data into the memory cell Q5 or reading data from the memory cell Q5 is described. To program data into the one-time programmable read only memory, a bias voltage smaller than 0V, for example, a bias voltage smaller than −5V is applied to a selected word line WL2 while the non-selected word lines WL1 and WL2 are set in a floating state. In the meantime, a bias voltage greater than 0V, for example, a bias voltage greater than 5V is applied to a selected bit line BL2 while the non-selected bit lines BL1 and BL3 are set in the floating state. As a result, the selected memory cell Q5 breaks down to define a digital value of '0' while the non-selected memory cells Q1~Q4 and Q6~Q9 remain connected to define a digital value of '1'.

The present invention also provides an alternative process of programming data into the one-time programmable read only memory. First, a bias voltage smaller than 0V, for example, a bias voltage smaller than −5V is applied to a selected word line WL2 while the non-selected word lines WL1 and WL2 are connected to a ground. In the meantime, a bias voltage greater than 0V, for example, a bias voltage greater than 5V is applied to a selected bit line BL2 while a small negative bias voltage such as −2V is applied to the non-selected bit lines BL1 and BL3. As a result, the selected memory cell Q5 breaks down to define a digital value of '0' while the non-selected memory cells Q1~Q4 and Q6~Q9 remain connected to define a digital value of '1'.

The present invention also provides yet another alternative process of programming data into the one-time programmable read only memory. First, the selected word line WL2 is connected to a ground while the non-selected word lines WL1 and WL3 are set to a floating state. Meanwhile, a bias voltage greater than 0V, for example, a bias voltage greater than 10V is applied to the selected bit line BL2 while the non-selected bit lines BL1 and BL3 are connected to a ground. As a result, the selected memory cell Q5 breaks down to define a digital value of '0' while the non-selected memory cells Q1~Q4 and Q6~Q9 remain connected to define a digital value of '1'.

To read data from the one-time programmable read only memory cell of the present invention, the selected word line WL2 is connected to a ground while the non-selected word lines WL1 and WL3 are set to a floating state. Meanwhile, a bias voltage of about 3.3V is applied to the selected bit line BL2 while the non-selected bit lines BL1 and BL3 are connected to a ground. The stored data value is determined according to the sensed current Isens. If the memory cell has been programmed to a '0' logic state, the memory cell is broken so that a large current Isens is detected. On the other hand, if the memory cell has been programmed to a '1' logic state, the memory cell is connected and a small current Isens is detected.

Figures 2A, 2B:
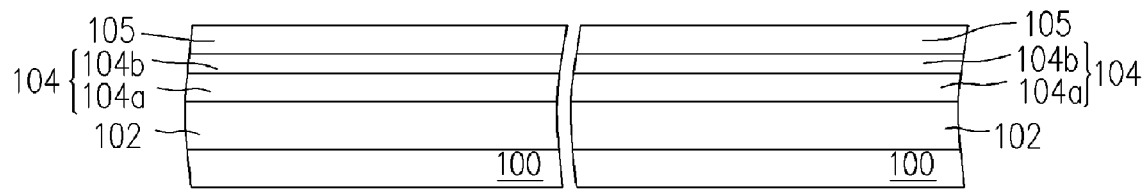

FIGS. 2A through 9A and FIGS. 2B through 9B are schematic cross-sectional views along lines A-A' and B-B' of FIG. 1A showing the steps for fabricating the one-time programmable read only memory according to the first embodiment of the present invention. As shown in FIGS. 2A and 2B, a semiconductor substrate 100 such as a P-type semiconductor substrate is provided. Thereafter, an N-type doping region 102 is formed in the semiconductor substrate 100. The N-type doping region 102 is formed, for example, by implanting dopants such as arsenic, phosphorus or nitrogen at a dosage of about $5 \times 10^{17}/cm^3$ to a depth of about 2500 Å.

A P-type doping region 103 comprising a P$^+$-type doping region 104a and a P-type doping region 104b is formed over the N-type doping region 102. The P$^+$-type doping region 104a has a dopant concentration higher than the P-type doping region 104b. Furthermore, the P$^+$-type doping region 104a has an implant depth greater than the P-type doping region 104b. The P-type doping region 104b serves as a P-type doping region for the diode and the P$^+$-type doping region 104a serves as a bit line. The P$^+$-type doping region 104a and the P-type doping region 104b are formed, for example, by implanting boron at a dosage level of $7 \times 10^{19}/cm^3$ or boron difluoride at a dosage level of $5 \times 10^{18}/cm^3$.

An N-type doping region 105 is formed over the P-type doping region 103. The N-type doping region 105 is formed, for example, by implanting dopants such as arsenic, phosphorus or nitrogen at a dosage level of $5 \times 10^{18}/cm^3$ to a depth of about 500 Å.

Thereafter, an annealing operation is carried out to drive the implanted dopants into the semiconductor substrate 100 so that the N-type doping region 105, the P-type doping region 103 (including the P-type doping region 104b and the P$^+$-type doping region 104a) and the N-type doping region 102 are activated. The annealing process is carried out at a temperature of about 1000° C., for example.

Figures 3A, 3B:
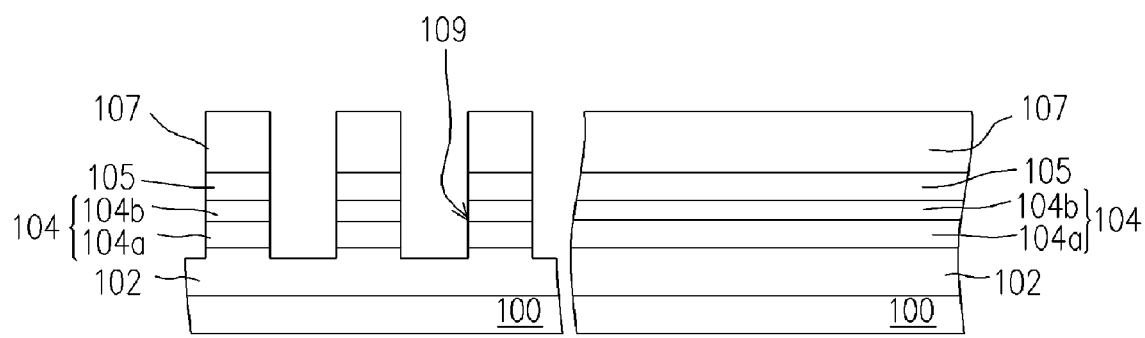

As shown in FIGS. 3A and 3B, a patterned photoresist layer 107 is formed over the semiconductor substrate 100. The patterned photoresist layer 107 has a linear structure extending in the Y direction (as shown in FIG. 1A). Using the patterned photoresist layer 107 as an etching mask, a portion of the semiconductor substrate 100 is removed to form a trench 109 and expose at least a portion of the N-type doping region 102. The trench 109 partitions the P-type doping region 103 into linear-shape P-type doping layers 104. In the present embodiment, the etching depth is around 2000 Å to produce a stack structure comprising an N-type doping region 102, a P-type doping region 104b, a P$^+$-type doping region 104a and an N-type doping region 105 in the semiconductor substrate 100 each having a thickness of about 500 Å. In the etching process, chlorine-containing gases, hydrogen chloride or ozone are used as the etchant, for example.

Figures 4A, 4B:
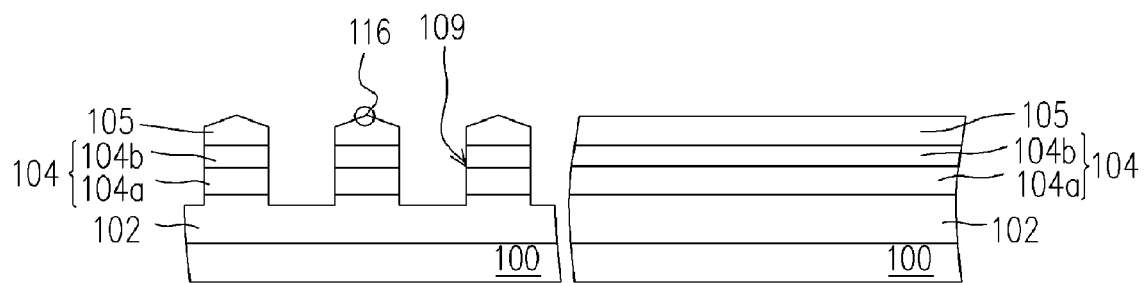

As shown in FIGS. 4A and 4B, the patterned photoresist layer 107 is removed. Thereafter, another etching process is carried out to remove a portion of the N-type doping region 105 to produce a sharp edge 116 on the top surface of the N-type doping region 105. In the etching process, chlorine-containing gases, hydrogen chloride or ozone are used as the etchant, for example. In general, the sharp edge 116 on the N-type doping layer 105 is produce by controlling the flow rate, the mixing ratio or the pressure of the gaseous etchant.

Figures 5A, 5B:
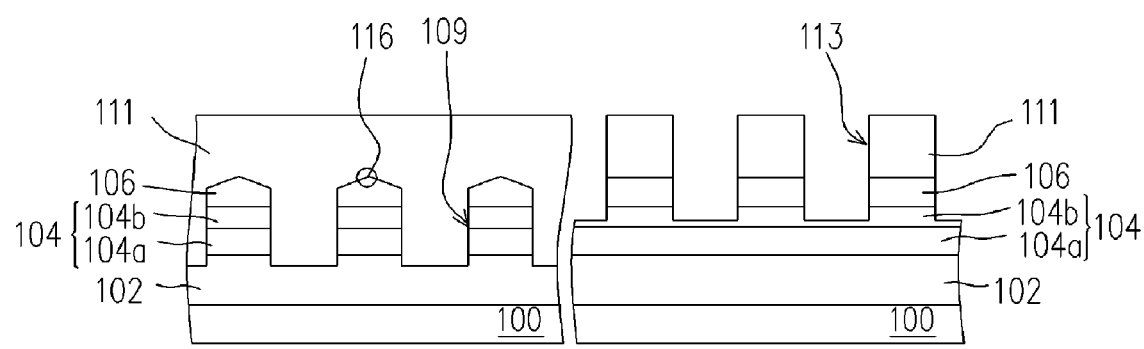

As shown in FIGS. 5A and 5B, another patterned photoresist layer 111 is formed over the semiconductor substrate 100. The patterned photoresist layer 111 has a linear structure extending in the X direction (as shown in FIG. 1A). Using the patterned photoresist layer 111 as an etching mask, an etching operation is carried out to remove a portion of the semiconductor substrate 100 and form a trench 113 that exposes at least a portion of the P-type doping layer 104. After the etching process, the trench 109 and the trench 111 together partition the N-type doping region 105 into independent block-shape N-type doping layer 106. In the present embodiment, the etching depth is about 750 Å, for example. In the etching process, chlorine-containing gases, hydrogen chloride or ozone are used as the etchant, for example.

As shown in FIGS. 6A and 6B, the photoresist layer 111 is removed. Thereafter, an anti-fuse layer 108, an etching stop layer 110 and an inter-layer insulating layer 112 are sequentially formed over the semiconductor substrate 100. The anti-fuse layer 108 is formed, for example, by performing a chemical vapor deposition process. The anti-fuse layer 108 is a silicon oxide layer having a thickness of about 100 Å, for example. Obviously, the anti-fuse layer 108 can be fabricated using a high dielectric constant (a dielectric constant greater than 4) material including silicon-nitride, silicon-oxynitride, aluminum oxide or hafnium oxide, for example. The etching stop layer 110 is a silicon nitride layer having a thickness of about 100 Å, for example. The inter-layer insulating layer 112 comprises a borophosphosilicate glass layer 112a and a silicon oxide layer 112b, for example. The borophosphosilicate glass layer 112a has a thickness of about 2000 Å and the silicon oxide layer 112b has a thickness of about 2000 Å. The inter-layer insulating layer 112 is formed, for example, by depositing borophosphosilicate glass material to a thickness of about 4000 Å in a chemical vapor deposition process. Thereafter, a planarization process is performed to remove a thickness of about 2000 Å from the borophosphosilicate glass layer and form the borophosphosilicate glass layer 112a. Lastly, a plasma enhanced chemical vapor deposition process is carried out using tetra-ethyl-ortho-silicate as the gaseous reactants to form a silicon oxide layer 112b having a thickness of about 200 Å over the borophosphosilicate glass layer 112a. The method of planarizing the borophosphosilicate glass layer includes a chemical-mechanical polishing process, for example. Clearly, the inter-layer insulating layer 112 can be a single layer fabricated using an insulating material commonly used in semiconductor manufacturing.

As shown in FIGS. 7A and 7B, a patterned photoresist layer 115 is formed over the inter-layer insulating layer 112. The patterned photoresist layer 115 has a linear structure extending in the X direction (as shown in FIG. 1A). Using the patterned photoresist layer 115 as a mask, an etching process is carried out to remove a portion of the inter-layer insulating layer 112 and form a trench 118. The trench 118 is disposed over the N-type doping layer 106. Since the etching stop layer 110 and the inter-layer insulating layer 112 has different etching selectivity, the etching process will stop exactly on the etching stop layer 110.

Figures 8A, 8B:
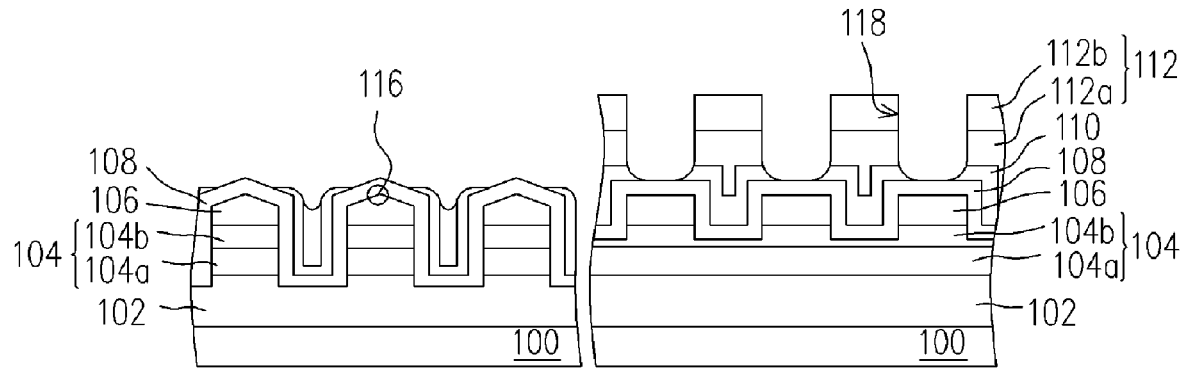

As shown in FIGS. 8A and 8B, using the patterned photoresist layer 115 as a mask, a portion of the etching stop layer 110 exposed by the trench 118 is removed to expose the anti-fuse layer 108. The method of removing the etching stop layer 110 includes performing a wet etching operation. When the etching stop layer 110 is a silicon nitride layer, hot phosphoric acid is used as the etching solution. Because the etching stop layer 110 and the anti-fuse layer 108 have different etching selectivity, the thickness of the anti-fuse layer 108 after the etching operation has very little variation. In other words, the anti-fuse layer 108 can have a better thickness control. In the process of removing a portion of the etching stop layer 110, a small amount of material will be removed from the inter-layer insulating layer 112 so that the dimension of the trench 118 expands a little. Furthermore, the etching process also renders areas around the top corner region of the anti-fuse layer 108 exposed so that the thickness of the anti-fuse layer 108 can be used to control the breakdown voltage. Thereafter, the patterned photoresist layer 115 is removed.

Figures 9A, 9B:
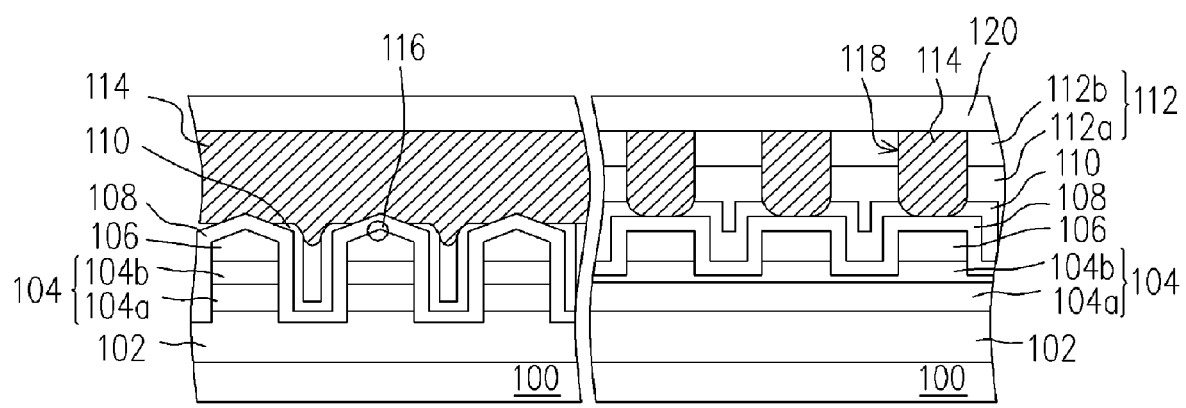

As shown in FIGS. 9A and 9B, a electrically conductive layer 114 is formed in the trench 118. The electrically conductive layer is fabricated using, for example, electrically conductive doped semiconductor, doped polysilicon, metallic material (for example, copper or tungsten). The electrically conductive layer 114 is formed, for example, by depositing electrically conductive material into the trench 118 to form a electrically conductive material layer (not shown) and then removing the electrically conductive material outside the trench 118. The method of removing the electrically conductive material outside the trench 118 includes, for example, performing an etching back process or a chemical-mechanical polishing process. Thereafter, a passivation layer 120 is formed over the semiconductor substrate 100. The passivation layer 120 is a silicon nitride or silicon oxide formed, for example, by performing a chemical vapor deposition process.

In the aforementioned method of fabricating a one-time programmable read only memory, a patterned NPN structure is formed in the semiconductor substrate 100 and then a photolithographic and etching process is applied twice to define the bit lines and the tower-like structures and form isolated mono-crystalline PN diodes and bit lines. Since the PN (or NP) diode is formed within the same semiconductor layer fabricated from mono-crystalline silicon semiconductor substrate, the crystallized poly-crystalline semiconductor substrate, or silicon-on-insulator (SOI) substrate, the properties at the PN (or the NP) junction is more uniform, comparing to that of U.S. Pat No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance. Furthermore, the memory cell has a simpler structure so that fewer masks are needed to fabricate the memory cell. Hence, the total cost of producing the memory is reduced.

Because the N-type doping layer 106 has a tower structure, the breakdown region of the anti-fuse layer 108 is self-limited so that an ideal logic state can be produced. Furthermore, the etching process produces a bulging sharp edge 116 on the surface of the N-type doping layer 106. The sharp edge 116 concentrate electric charges so that the anti-fuse layer 108 is more readily broken through an electrostatic discharge. Hence, programming can be carried out at a lower voltage.

In addition, a self-aligned process is used to form a memory cell structure between a word line and a bit line in the fabrication of the one-time programmable read only memory. Hence, the total number of masking step is reduced. Moreover, the self-aligned process is capable of producing memory cells with a smaller and tighter dimension so that the level of integration of the memory device can be increased.

The breakdown voltage and device performance of the memory can be controlled by changing the material constituting the anti-fuse layer 108. Furthermore, the anti-fuse layer 108 is formed after isolating the PN (or the NP) diode structure. Hence, the material of anti-fuse layer can be easily changed. In addition, an etching stop layer 110 is disposed over the anti-fuse layer 108. Since the etching stop layer 110 has an etching selectivity different from the anti-fuse layer 108, the anti-fuse layer 108 can have a standard thickness.

Moreover, the breakdown voltage of the memory cell is determined by the thickness of the anti-fuse layer 108 and the thickness of the anti-fuse layer 108 is determined by the deposition process rather than the etching and chemical-mechanical polishing process. In other words, the method of the present invention can have a larger processing window because the processing window is unaffected by the etching and the chemical-mechanical polishing process.

Figure 10A:
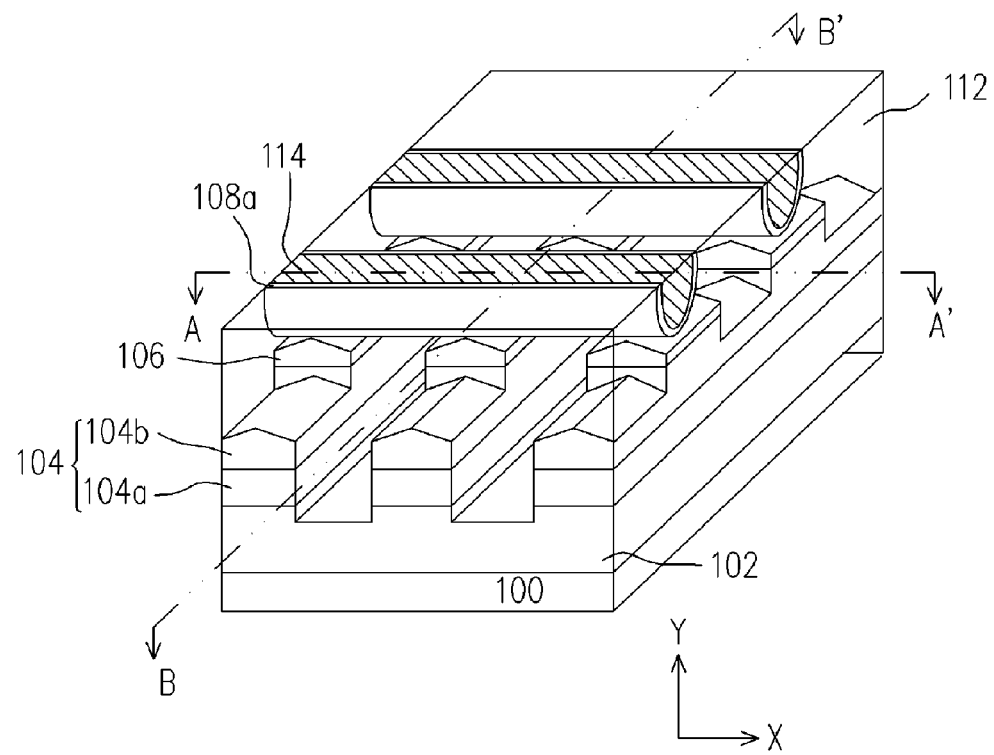
FIG. 10A is a perspective view of an one-time programmable read only memory according to a second embodiment of the present invention.
Figures 10B, 10C:
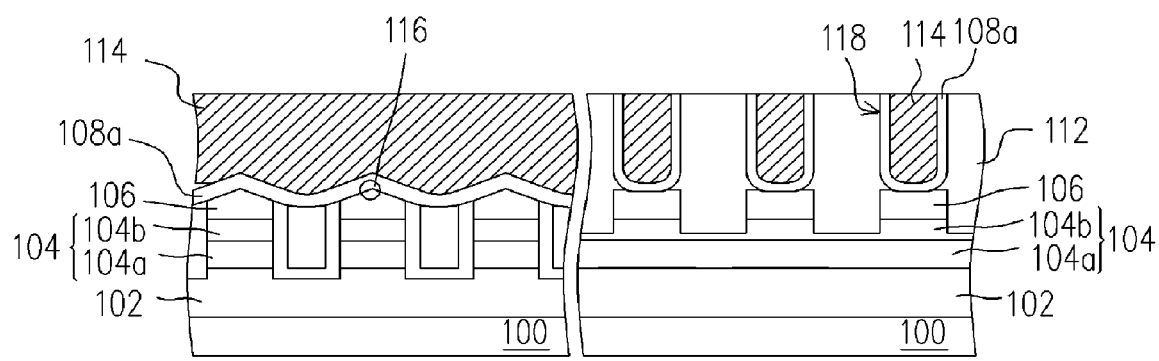
FIGS. 10B and 10C are schematic cross-sectional views along line A-A' and B-B' of FIG. 10A.

FIG. 10A is a perspective view of a one-time programmable read only memory according to a second embodiment of the present invention. FIGS. 10B and 10C are schematic cross-sectional views along line A-A' and line B-B' of FIG. 10A. In FIGS. 10A to 10C, components identical to the ones in FIGS. 1A to 1C are labeled identically. In the following, only those aspects of the second embodiment that differ from the first embodiment are described.

As shown in FIGS. 10A to 10C, the anti-fuse layer 108 and the etching stop layer 110 are directly disposed over the inter-layer insulating layer 112 rather than disposing over the semiconductor substrate 100 (as shown in FIGS. 1A to 1C). The insulating layer 112 has a trench 118 that directly exposes the N-type doping layer 106. The anti-fuse layer 108a is disposed inside the trench 118 covering the bottom and sidewalls of the trench 118. The electrically conductive layer 114 is disposed over the anti-fuse layer 108a and completely filling the trench 118.

Since the PN (or NP) diode of the aforementioned one-time programmable read only memory is formed within the same semiconductor layer fabricated from mono-crystalline silicon semiconductor substrate, the crystallized poly-crystalline semiconductor substrate, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance.

Because the N-type doping layer 106 has a tower structure, the breakdown region of the anti-fuse layer 108a is self-limited so that an ideal logic state is produced. Furthermore, the surface of the N-type doping layer 106 has a bulging sharp edge 116. The sharp edge 116 concentrates electric charges so that the anti-fuse layer 108a is more readily broken by an electrostatic discharge. Ultimately, the programming voltage for the memory can be reduced.

Since the one-time programmable read only memory of the present invention has a simple structure, the cost of fabricating the memory cell can be lowered. Moreover, the breakdown voltage and the device performance of the memory can be systematically controlled through changing the material used for fabricating the anti-fuse layer 108a.

Although the process of forming an NPN structure in a P-type semiconductor substrate the is used to illustrate the fabrication of the one-time programmable read only memory, it is equally feasible to use the aforementioned process to form a PNP structure in an N-type semiconductor substrate.

Figures 11A, 11B:
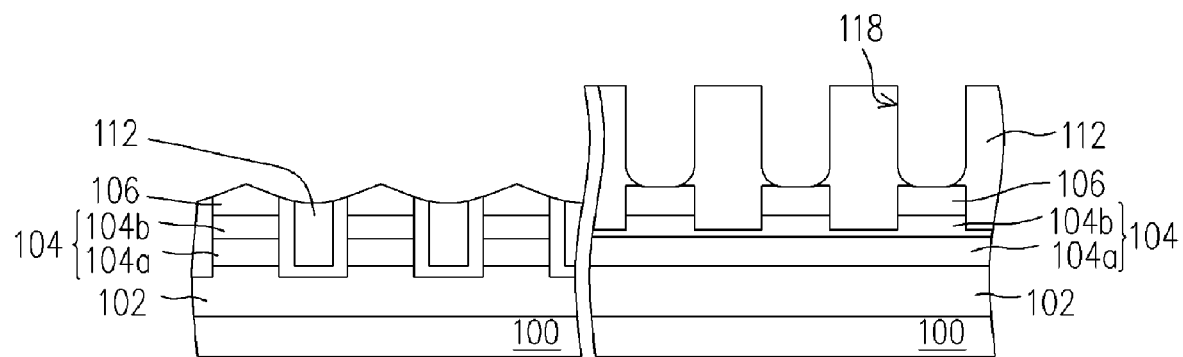
FIGS. 11A and 12A and FIGS. 11B and 12B are schematic cross-sectional views along lines A-A' and B-B' of FIG. 10A showing the steps for fabricating the one-time programmable read only memory according to the second embodiment of the present invention.

FIGS. 11A and 12A and FIGS. 11B and 12B are schematic cross-sectional views along lines A-A' and B-B' of FIG. 10A showing the steps for fabricating the one-time programmable read only memory according to the second embodiment of the present invention. FIGS. 11A and 11B is a continuation of the processing step carried out from FIGS. 2A and 2B to FIGS. 5A and 5B in the first embodiment of the present invention. As shown in FIGS. 11A and 11B, after removing the patterned photoresist layer 111, an inter-layer insulating layer 112 is formed over the semiconductor substrate 100. The inter-layer insulating layer 112 can have a two-layered structure similar to the one in the first embodiment or a single structure or a multi-layered structure. The inter-layer insulating layer 112 can be fabricated using any common insulating materials in semiconductor manufacturing processes. Thereafter, a trench 118 that exposes a portion of the N-type doping layer 106 is formed in the inter-layer insulating layer 112. The trench 118 has a linear structure extending in the X direction (as shown in FIG. 10A). The sharp edge on the top surface of the N-type doping layer 106 may be blunted a little after the etching process.

Figures 12A, 12B:
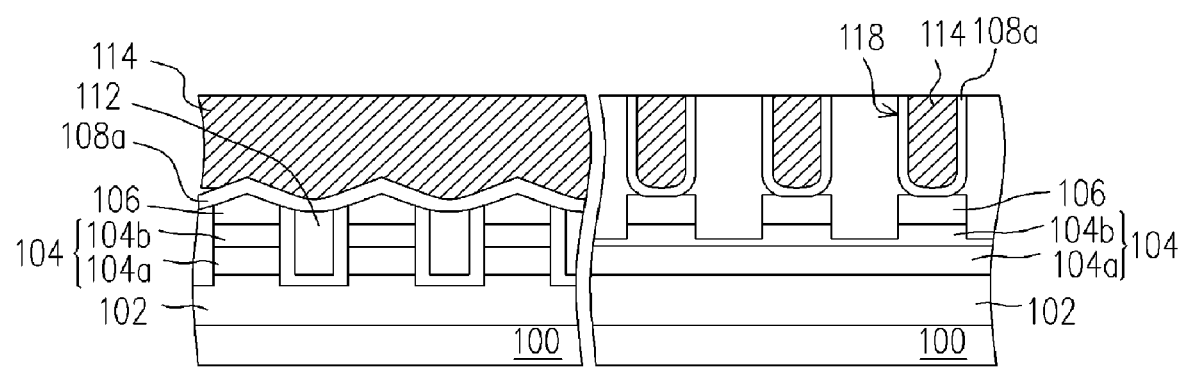

As shown in FIGS. 12A and 12B, an anti-fuse layer 108a is formed on the bottom and sidewall surface of the trench 118. Thereafter, an electrically conductive layer 114 is formed over the semiconductor substrate 100 to fill the trench 118 completely. The anti-fuse layer 108a and the electrically conductive layer 114 are formed, for example, by depositing dielectric material over the semiconductor substrate 100 in a chemical vapor deposition to form a dielectric material layer over the interior surface of the trench. Thereafter, electrically conductive material is deposited to fill the trench 118. Any the dielectric material layer and the electrically conductive material layer outside the trench 118 are removed by performing a chemical-mechanical polishing operation. After that, other processes necessary for completing the fabrication of the memory devices are carried out. Since conventional techniques are used in these subsequent processes, detailed description is omitted.

Since the anti-fuse layer 108a is formed after defining the word line pattern (the trench 118), anti-fuse material can be easily changed and the thickness of the anti-fuse layer 108a is unaffected by the etching operation. Furthermore, by changing the anti-fuse material, the breakdown voltage and device performance can be easily controlled.

In addition, the breakdown voltage of the memory cell is determined by the thickness of the anti-fuse layer 108a and the thickness of the anti-fuse layer 108a is determined by the deposition process rather than the etching and chemical-mechanical polishing process. That means, the processing window the present invention is larger because the processing window is unaffected by the etching and chemical-mechanical polishing operation.

Unlike the first embodiment, the second embodiment does not require the fabrication of an etching stop layer. Hence, the fabrication process is simpler and costs less to produce.

Figure 13A:
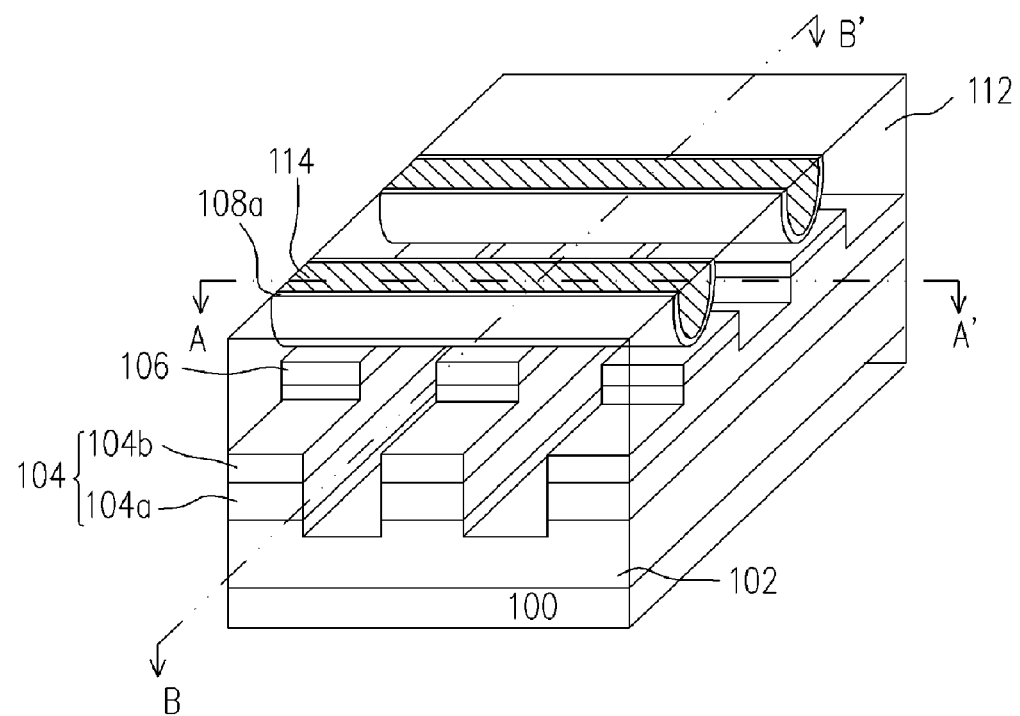
FIG. 13A is a perspective view of an one-time programmable read only memory according to a third embodiment of the present invention.
Figures 13B, 13C:
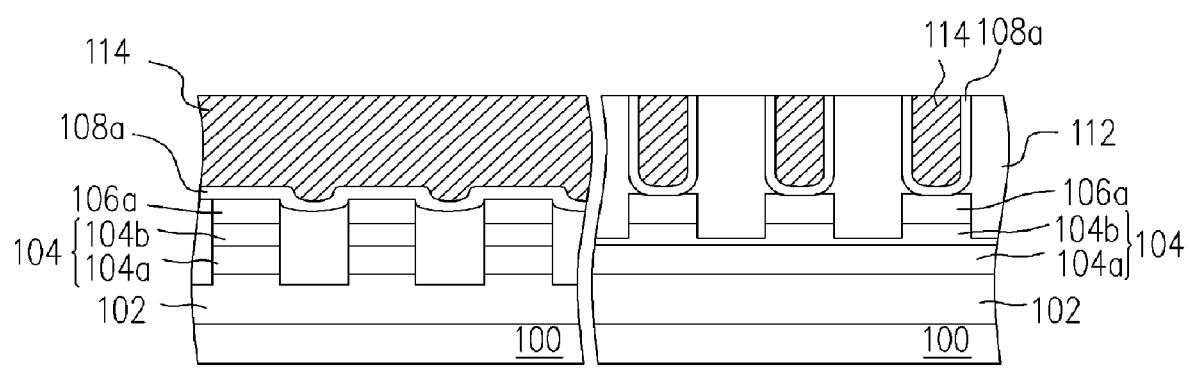
FIGS. 13B and 13C are schematic cross-sectional views along line A-A' and B-B' of FIG. 13A.

FIG. 13A is a perspective view of a one-time programmable read only memory according to a third embodiment of the present invention. FIGS. 13B and 13C are schematic cross-sectional views along line A-A' and B-B' of FIG. 13A. In FIGS. 13A to 13C, components identical to the ones in FIGS. 1A to 1C are labeled identically. In the following, only those aspects of the third embodiment that differ from the first and the second embodiment are described.

As shown in FIGS. 13A to 13C, the top surface of the N-type doping layer 106a is flat. There is no sharp edge on the top surface of the N-type doping layer 106a.

Since the PN (or NP) diode of the aforementioned one-time programmable read only memory is formed within the same semiconductor layer fabricated from mono-crystalline silicon semiconductor substrate, the crystallized poly-crystalline semiconductor substrate, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance.

Since the one-time programmable read only memory of the present invention has an even simpler structure compared with the first and the second embodiment, the cost of fabricating the memory cell can be lowered considerably. Moreover, the breakdown voltage and the device performance of the memory can be systematically controlled through changing the material used for fabricating the anti-fuse layer 108a.

Although the process of forming an NPN structure in a P-type semiconductor substrate the is used to illustrate the fabrication of the one-time programmable read only memory, it is equally feasible to use the aforementioned process to form a PNP structure in an N-type semiconductor substrate.

Figures 14A, 14B:
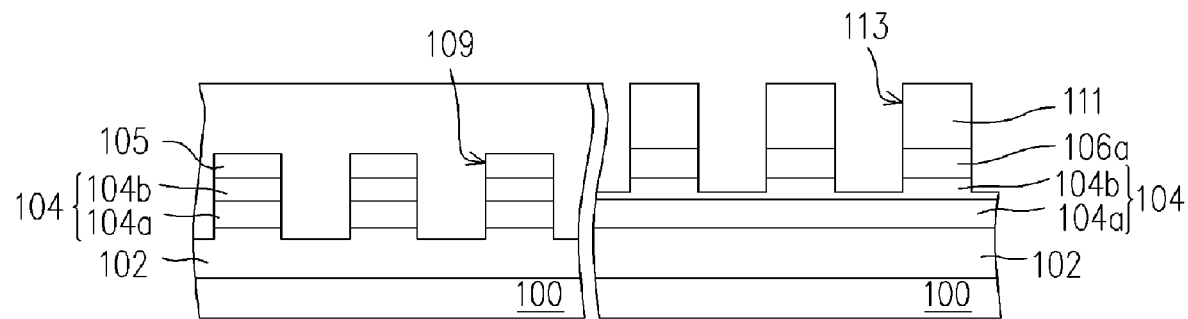

FIGS. 14A through 16A and FIGS. 14B through 16B are schematic cross-sectional views along lines A-A' and B-B' of FIG. 13A showing the steps for fabricating the one-time programmable read only memory according to the third embodiment of the present invention. FIGS. 14A and 14B is a continuation of the processing step carried out from FIGS. 2A and 2B to FIGS. 3A and 3B in the first embodiment of the present invention.

As shown in FIGS. 14A and 14B, after removing the patterned photoresist layer 107, another patterned photoresist layer 111 is formed over the semiconductor substrate 100. The patterned photoresist layer 111 has linear structure extending in the X direction (as shown in FIG. 13A). Thereafter, using the patterned photoresist layer 111 as an etching mask, an etching process is carried out to remove a portion of the semiconductor substrate 100 and form a trench 113 that exposes at least a portion of the P-type doping layer 104. After the etching operation, the trenches 109 and 111 partition the N-type doping region 105 into block-shape N-type doping layers 106a. The N-type doping layer 106a has a planar surface.

Figures 15A, 15B:
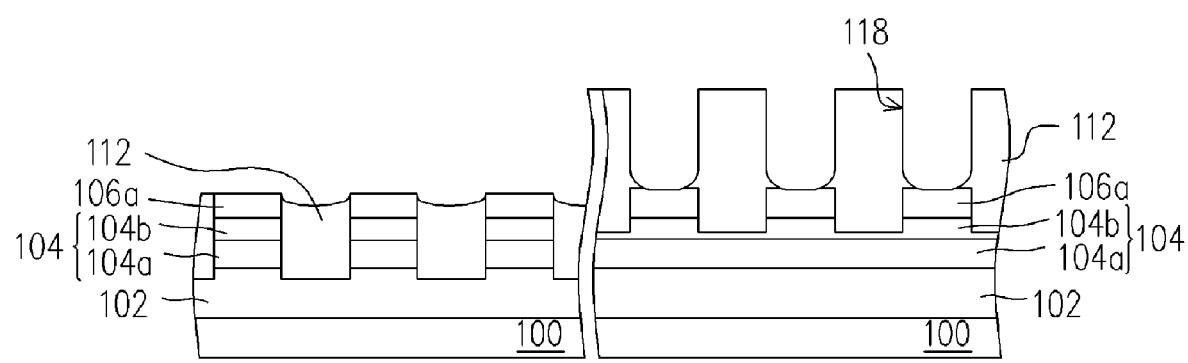

As shown in FIGS. 15A and 15B, the patterned photoresist layer 111 is removed. Thereafter, an inter-layer insulating layer 112 is formed over the semiconductor substrate 100. The inter-layer insulating layer 112 can have a two-layered structure as shown in the first embodiment or a single layer or multi-layered structure. The inter-layer insulating layer 112 can be fabricated using any common insulating material in semiconductor fabrication processes. Next, a trench 118 that exposes a portion of the N-type doping layer 106a is formed in the inter-layer insulating layer 112. The trench 118 has a linear structure extending in the X direction (as shown in FIG. 13A).

Figures 16A, 16B:
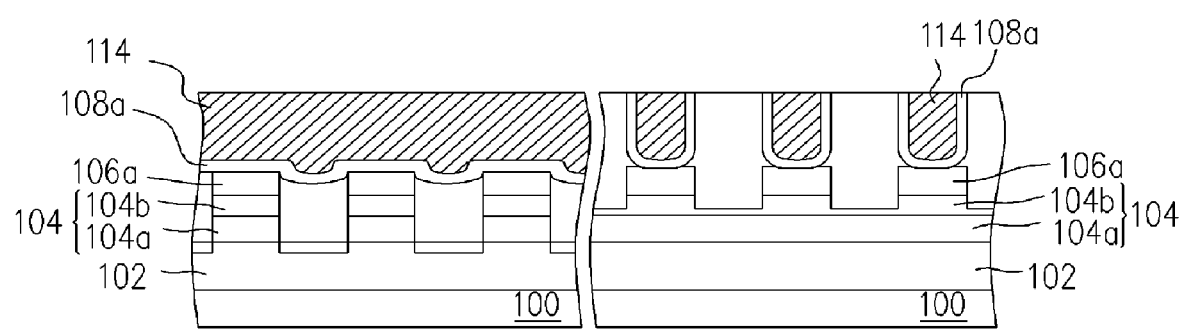

As shown in FIGS. 16A and 16B, an anti-fuse layer 108a is formed on the bottom and sidewall surface of the trench 118. Thereafter, an electrically conductive layer 114 is formed over the semiconductor substrate 100 to fill the trench 118 completely. The anti-fuse layer 108a and the electrically conductive layer 114 are formed, for example, by depositing dielectric material over the semiconductor substrate 100 in a chemical vapor deposition to form a dielectric material layer over the interior surface of the trench. Thereafter, electrically conductive material is deposited to fill the trench 118. Any the dielectric material layer and the electrically conductive material layer outside the trench 118 are removed by performing a chemical-mechanical polishing operation. After that, other processes necessary for completing the fabrication of the memory devices are carried out. Since conventional techniques are used in these subsequent processes, detailed description is omitted.

In the aforementioned method of fabricating the one-time programmable read only memory, a patterned NPN (or PNP) structure is formed in the semiconductor substrate. Thereafter, two photolithographic and etching processes are carried out to define a bit line and a silicon tower structure and form an isolated mono-crystalline silicon PN diode and bit line. Since the PN (or NP) diode is formed within the same semiconductor layer fabricated from mono-crystalline silicon semiconductor substrate, the crystallized poly-crystalline semiconductor substrate, or silicon-on-insulator (SOI) substrate, the properties at the PN (or the NP) junction is more uniform, comparing to that of U.S. Pat. No. 6,185,122 and the leakage current under reverse bias is very lower than the polysilicon diode in order of magnitude. Consequently, using this PN (or NP) junction manufacturing, the PN (or the NP) junction of the one-time programmable read only memory cells can have consistent properties, a low leakage current and a high average device performance. Furthermore, the memory cell has a simple structure. Hence, fewer masks are required to fabricate the memory cells and the total cost of producing of the memory is reduced.

In addition, a self-aligned process is used to form a memory cell structure between a word line and a bit line in the fabrication of the one-time programmable read only memory. Hence, the total number of masking step is reduced. Moreover, the self-aligned process is capable of producing memory cells with a smaller and tighter dimension so that the level of integration of the memory device can be increased.

Since the anti-fuse layer 108a is formed after defining the word line pattern (the trench 118), anti-fuse material can be easily changed and the thickness of the anti-fuse layer is unaffected by the etching operation. Furthermore, by changing the anti-fuse material, the breakdown voltage and device performance can be easily controlled.

In addition, the breakdown voltage of the memory cell is determined by the thickness of the anti-fuse layer 108 and the thickness of the anti-fuse layer 108 is determined by the deposition process rather than the etching and chemical-mechanical polishing process. That means, the present invention can have a larger processing window because the processing window is unaffected by the etching and the chemical-mechanical polishing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor structure, comprising:

providing a first electrically conductive type semiconductor substrate;

forming a second electrically conductive type doping region, a first electrically conductive type second doping layer, a first electrically conductive type first doping layer and a second electrically conductive type first doping layer sequentially in the first electrically conductive type semiconductor substrate;

patterning the first electrically conductive type semiconductor substrate to form a linear-shape first electrically conductive type second doping layer, a block-shape first electrically conductive type first doping layer and a block-shape second electrically conductive type first doping layer;

performing an etching operation to produce a sharp edge at the top section of the block-shape second electrically conductive type first doping layer;

forming an anti-fuse layer over the first electrically conductive type semiconductor substrate;

forming an etching stop layer over the anti-fuse layer;
forming an inter-layer insulating layer over the etching stop layer;
patterning the inter-layer insulating layer to form a trench that exposes a portion of the etching stop layer and crosses over the linear-shape second electrically conductive type first doping layer;
removing etching stop layer exposed by the trench; and
forming a electrically conductive layer inside the trench.

2. The method of claim 1, wherein the step for patterning the first electrically conductive type semiconductor substrate to form the linear-shape first electrically conductive type second doping layer, the block-shape first electrically conductive type first doping layer and the block-shape second electrically conductive type first doping layer further comprises:
performing a first patterning operation to remove a portion of the second electrically conductive type first doping layer, the first electrically conductive type first doping layer and the first electrically conductive type second doping layer and form a linear-shape second electrically conductive type first doping layer, a linear-shape first electrically conductive type first doping layer and a linear-shape first electrically conductive type second doping layer while exposing the second electrically conductive type doping region; and
performing a second patterning operation to remove a portion of the second electrically conductive type first doping layer and the first electrically conductive type first doping layer to form a liner-shape second electrically conductive type first doping layer and a block-shape first electrically conductive type first doping layer.

3. The method of claim 1, wherein the first electrically conductive type is a P-type and the second electrically conductive type is an N-type.

4. The method of claim 1, wherein the first electrically conductive type is an N-type and the second electrically conductive type is a P-type.

5. The method of claim 1, wherein the material constituting the anti-fuse layer comprises silicon oxide.

6. The method of claim 1, wherein the material constituting the anti-fuse layer has a dielectric constant greater than 4.

7. The method of claim 6, wherein the material constituting the anti-fuse layer comprises silicon-nitride, silicon-oxynitride, aluminum oxide or hafnium oxide.

8. The method of claim 6, wherein the first electrically conductive type second doping layer has a dopant concentration greater than the first electrically conductive type first doping layer.

* * * * *